United States Patent
Shun et al.

(10) Patent No.: US 7,322,836 B2
(45) Date of Patent: Jan. 29, 2008

(54) ELECTRICAL CONNECTOR WITH PICK CAP UP

(75) Inventors: Shi-Bin Shun, ShenZhen (CN); Yu-San Hsiao, Tu-Cheng (TW); Hai-Bo Wang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/656,211

(22) Filed: Jan. 22, 2007

(65) Prior Publication Data

US 2007/0190831 A1    Aug. 16, 2007

(30) Foreign Application Priority Data

Jan. 20, 2006    (TW)    ................ 95201389

(51) Int. Cl.
*H01R 13/44*    (2006.01)
(52) U.S. Cl. .................... 439/135; 439/940
(58) Field of Classification Search ................ 439/41, 439/135, 940
See application file for complete search history.

(56) References Cited

U.S. PATENT DOCUMENTS 5,277,601 A * 1/1994 Miyazawa ................ 439/135
5,383,797 A * 1/1995 Seong et al. ............... 439/569
5,507,657 A * 4/1996 Seto et al. ................. 439/135
5,613,864 A * 3/1997 Northey .................... 439/149
5,688,133 A * 11/1997 Ikesugi et al. ............ 439/135

* cited by examiner

*Primary Examiner*—Khiem Nguyen
(74) *Attorney, Agent, or Firm*—Wei Te Chung

(57) ABSTRACT

An electrical connector (1) includes a longitudinal insulative housing (10), a number of contacts (20) and a pick up cap. The insulative housing includes a first side wall (13) and a second side wall (14) opposed to the first side wall. The first side wall includes first and second longitudinally arranged thicker portions (131, 132) and a transitional portion (133) having a lateral dimension less than and spacing the first and the second thicker portions. The second side wall includes a third thicker portion. Each of the first, the second and the third thicker portions defines a number of passageways (134) therein. The pick up cap is attached to the housing, the pick up cap having a baseplate which defines a first plane provided for gripping by a vacuum device and a second plane parallel to the first plane, a plurality of engaging legs extending from the second plane of the baseplate and propping on inner face of the first, second portions of the first side wall and a plurality of resilient arms extending from the second plane and propping on the inner face of the transitional portion of the first side wall, so as to prevent the deformation of the housing during the process of being heated.

17 Claims, 5 Drawing Sheets

US 7,322,836 B2

ELECTRICAL CONNECTOR WITH PICK CAP UP

BACKGROUND OF THE INVENTION

1. Field of the Invention

The present invention relates to the art of electrical connectors, and more particularly to a high speed Serial Attached SCSI (Small Computer System Interface) (SAS) connector mounted on a printed circuit board (PCB).

2. Background of the Invention

Parallel ATA (Advanced Technology Attachment) and parallel SCSI are two dominant disk interfaces technologies today. The parallel ATA disks are widely used in desktop PCs and mobile PCs, and the parallel SCSI disks are mainly used in high-volume servers and subsystems. As disk interconnect speeds continue to rise, existing parallel ATA and parallel SCSI buses are reaching their performance limits because that parallel transmissions are susceptible to crosstalk across multiple streams of wide ribbon cable that adds line noise and can cause signal errors—a pitfall that has been remedied by slowing the signal, limiting cable length or both. Therefore, new interconnect technologies are needed to meet performance requirements going forward. The serial technology is emerging as a solution to the problem. The main advantage of serial technology is that while it does move data in a single point-to-point stream, it does so much faster than parallel technology because it is not tired to a particular clock speed.

Serial ATA (SATA) is a serial version of ATA, which is expected to be a replacement for parallel ATA. U.S. Pat. No. 6,331,122 discloses a type of SATA receptacle connector for being mounted on a Printed Circuit Board. The receptacle connector has two receiving cavities defined in an insulative housing thereof and two sets of conductive contacts respectively used for power and signal transmission installed in the insulative housing. U.S. Pat. No. D469,407 discloses an electrical connector assembly with a SATA plug connector as a part thereof. The plug connector has two generally L-shaped tongue plates receiving two sets of terminals for electrically connecting the conductive contacts as the tongue plates are inserted into the respective receiving cavities of the receptacle connector.

Serial Attached SCSI (SAS) is a successor to the parallel SCSI and is also based on serial technology. Besides the advantage of higher speed signal transmission, another most significant advantage is the SAS interface will also be compatible with SATA drives. In other words, the SATA plug connector can plug directly into an SAS receptacle connector if supported in the system. By this way, the system builders are flexible to integrate either SAS or SATA devices and slash the costs associated with supporting two separate interfaces.

FIG. 1 disclosed a known Serial Attached SCSI electrical connector 9 for electrically connecting exterior electrical element to PCB. The electrical connector 9 includes a dielectric housing 91, a plurality of electrical contacts 92 received in the housing 91, and a latching element 93 for positioning the housing on the PCB. The housing 91 defines two opposite first interior sidewalls 9125 in lengthwise direction, and an engaging slot 912 is formed between said two first interior sidewalls 9125 for receiving exterior electrical element. The first interior sidewall 9125 defines a plurality of receiving slot 915 for receiving corresponding contacts 92. The electrical contacts 92 includes a first contact 921, a second contact 922, a third contact 923, and a fourth contact 924 that have different shapes with regard to each other and received in the corresponding receiving slot 915, respectively. Each contact 92 includes an end extending above the housing 91, so as to be welded on the PCB. After the electrical connector 9 is placed on the PCB, a vacuum device is used to grip the planar surface of top end of the housing 91, so as to mount the electrical connector 9 onto the desired place on the PCB quickly and accurately. But the top planar surface of the housing does not provides an area big enough facilitating to be sucked by a vacuum device, so the connector 91 cannot meet the desires of an automatic manufacture.

Furthermore, before the connector is welded onto the PCB by use the SMT (Surface mounted technology, the electrical connector needs to be heated. When temperature up to desired, because resilient force of the contact effect on the first interior sidewall 9125, the engaging slot 912 that the second contact 922 received therein contracts toward inside, in other words, the space between the two first interior sidewalls 9125 of the engaging slot 912 is smaller than before, which is to guide the exterior electrical element cannot inserting into the engaging slot 912 and some function of the electrical connector may be invalidly.

In view of the foregoing, a new and improved electrical connector is desired to solve above-mentioned problems.

SUMMARY OF THE INVENTION

Accordingly, an object of the present invention is to provide an electrical connector with a pick up cap, which able to be gripped by a vacuum device without warpage during the process of being heated.

To achieve the above-mentioned object, in a preferred embodiment of the present invention, an electrical connector is provided and comprises an insulating housing, a number of contacts disposed therein and a pick-up cap placed on the housing. The insulative housing includes a first side wall and a second side wall opposed to the first side wall. The first side wall includes first and second longitudinally arranged thicker portions and a transitional portion having a lateral dimension less than and spacing the first and the second thicker portions. The second side wall includes a third thicker portion. Each of the first, the second and the third thicker portions defines a number of passageways therein. The pick up cap is attached to the housing, the pick up cap having a baseplate which defines a first plane provided for gripping by a vacuum device and a second plane parallel to the first plane, a plurality of engaging legs extending from the second plane of the baseplate and propping on inner face of the first, second portions of the first side wall and a plurality of resilient arms extending from the second plane and propping on the inner face of the transitional portion of the first side wall, so as to prevent the deformation of the housing during the process of being heated.

DETAILED DESCRIPTION OF THE PREFERRED EMBODIMENT OF THE INVENTION

Figure 1:
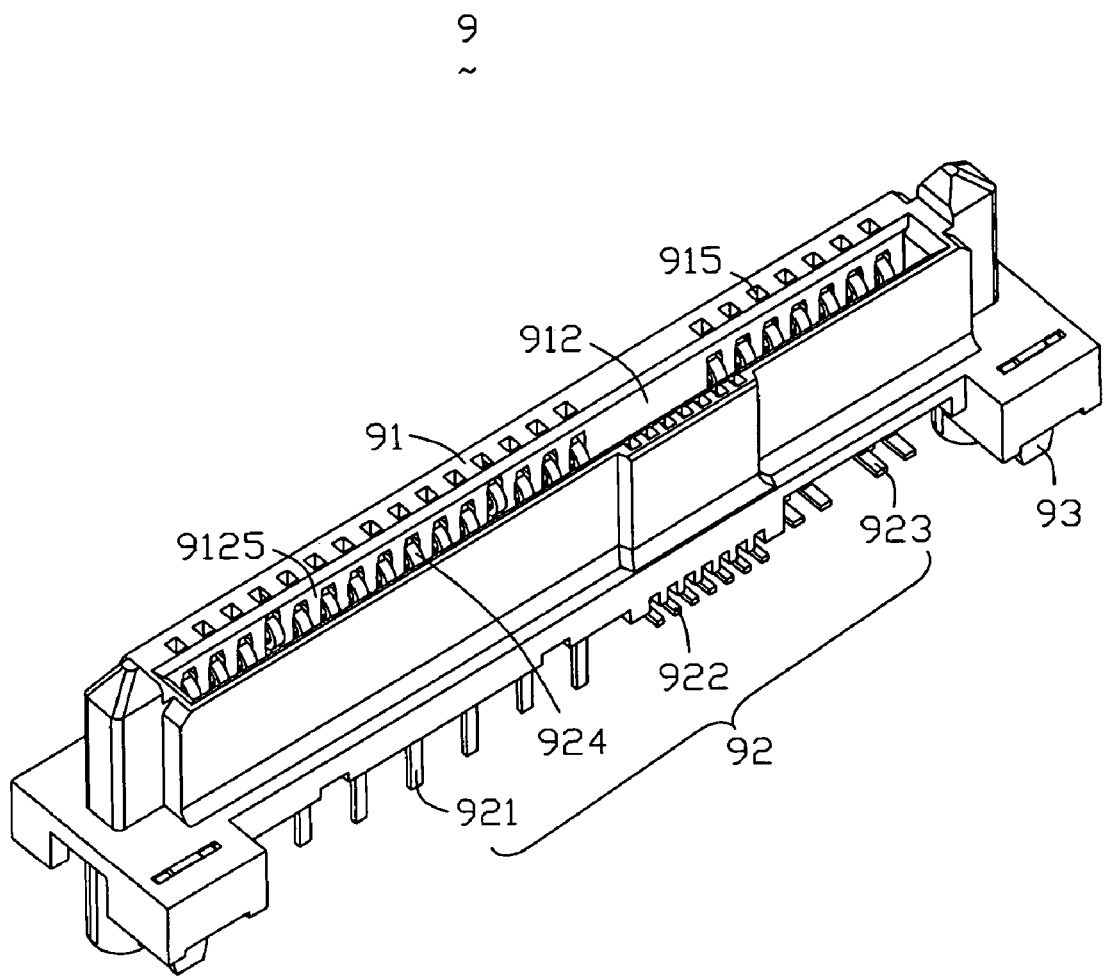
FIG. 1 is an assembly view of a known electrical connector.
Figure 2:
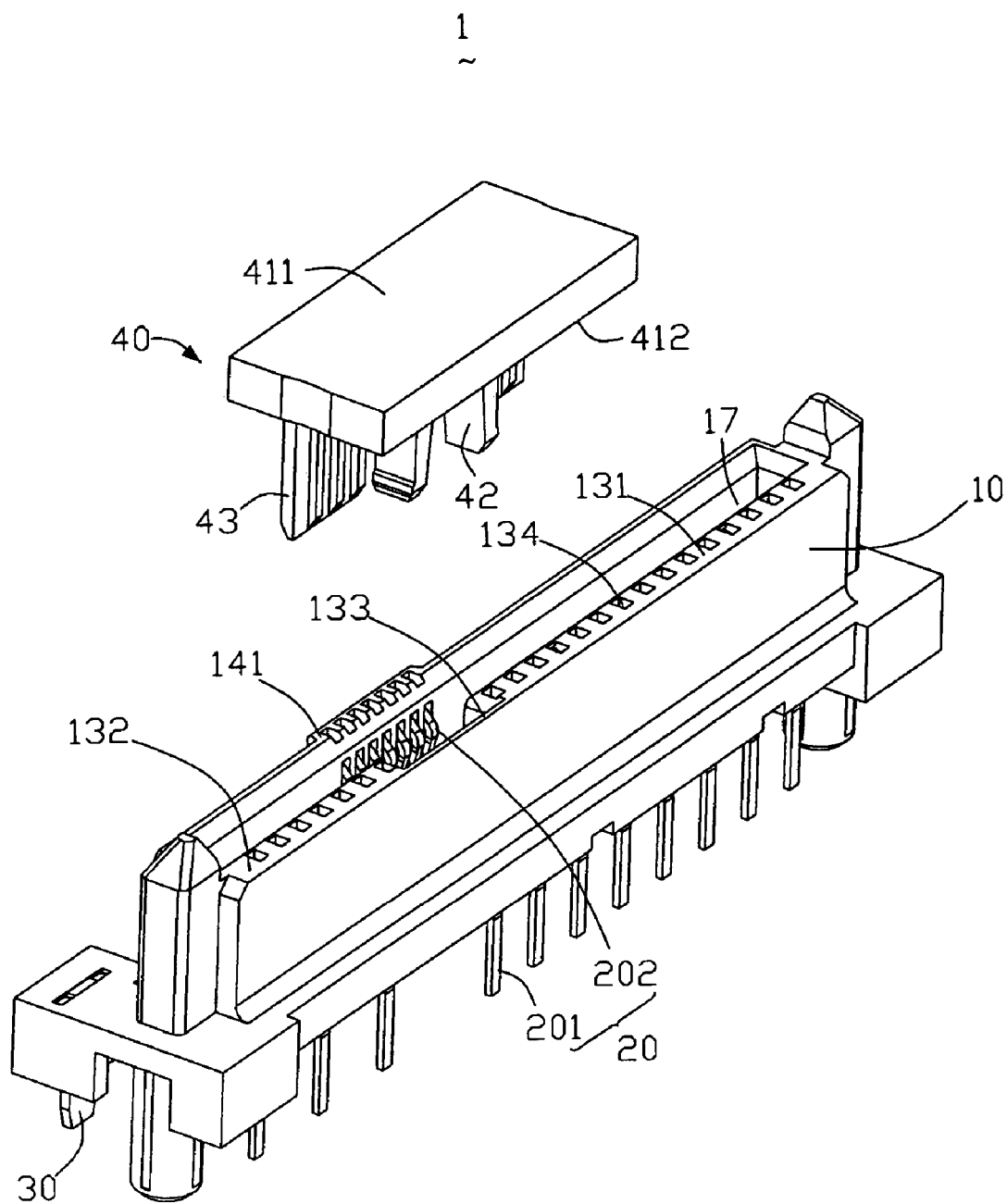
FIG. 2 is an assembled view of an electrical connector in accordance with the preferred embodiment of the present invention, but with the pick up cap not received in and attached to the housing.

A preferred embodiment of the present invention will be described hereunder with reference to the accompanying drawings FIGS. 2-5.

Referring to FIGS. 2 to 5, an electrical connector 1 in accordance with the preferred embodiment of the present invention is used for electrically connecting an exterior electrical component to a PCB. The electrical 1 includes a dielectric housing 10, a plurality of contacts 20 received in the housing 10, a latching component 30 received in the dielectric housing 10, and a pick up cap 40 attached to the dielectric housing 10.

Figure 3:
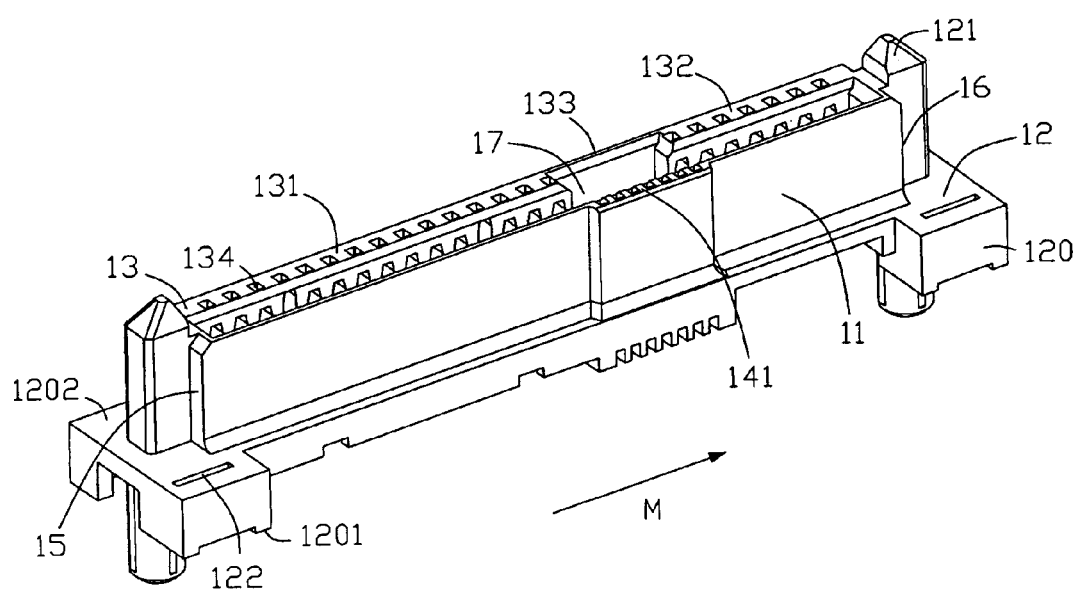
FIG. 3 is a perspective view of the housing of the FIG. 2.

The housing 10 extends along a direction of the arrow M (shown in the FIG. 3) and includes a base 11 and mounting portions 12 being disposed on two ends in lengthwise direction. The base 11 has a first and second opposite longitudinally extending side walls 13, 14, and two opposite laterally extending end walls 15, 16. The side and the end walls 13, 14, 15, 16 together define a receiving cavity 17 therebetween for receiving a complementary connector (not shown). The first side wall 13 has a first and a second thicker portions 131, 132 both thickening toward the receiving cavity 17. Each of the first and the second thicker portions 131, 132 is thicker in a lateral direction than and is spaced from each other by a transitional portion 133 located therebetween. The first thicker portion 131 has a longitudinal dimension larger than the second thicker portion 132. The second side wall 14 has a third thicker/expanded portion 141 which thickens away from the receiving cavity 17 and is thicker in a lateral direction than the other portion thereof. The third thicker portion 141 is located at a position substantially opposing to the transitional portion 133 of the first side wall 13 (as best shown in FIG. 3). The first, second and third thicker portions 131, 132, 141 each defines a plurality of passageways 134 therein.

The contacts 20 include a set of first contacts 201 and a set of second contact 202. The first contacts 201 are held in the passageways 134 of the first and second thicker portions 131, 132, and the second contacts 202 are held in the passageways 134 of the third thick portion 141 of the insulative housing 10

The mounting portion 12 defines a slablike portion 120 and a locating post 121 positioning the dielectric housing 10 on the PCB. The slablike portion 120 has a first surface 1201 beside the PCB and a second surface 1202 parallel and opposite to the first surface 1200, wherein the first, second surfaces 1201, 1202 all have a 90 angel with regard to the first side wall 13 of the housing 10. The locating post 121 extends above side first surface 1201 and the second surface 1202 to connect with the base 11. The slablike portion 120 further defines a retention slot 122 through the second surface 1202 to said first surface 1201. The metal latching element 30 inserts into the retention slot 122 in interference fit manner and extends above the first surface 1201.

Figure 4:
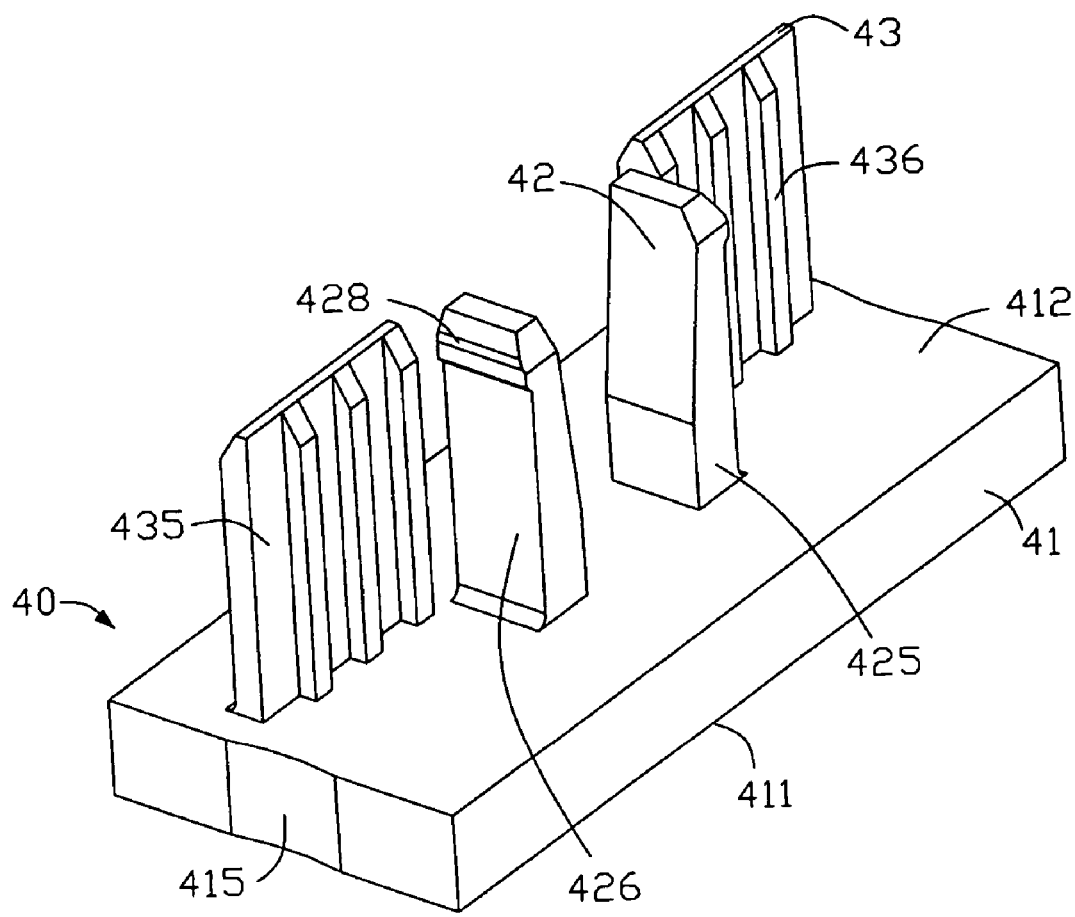
FIG. 4 is a perspective view of the pick up of the FIG. 2, but from another view.
Figure 5:
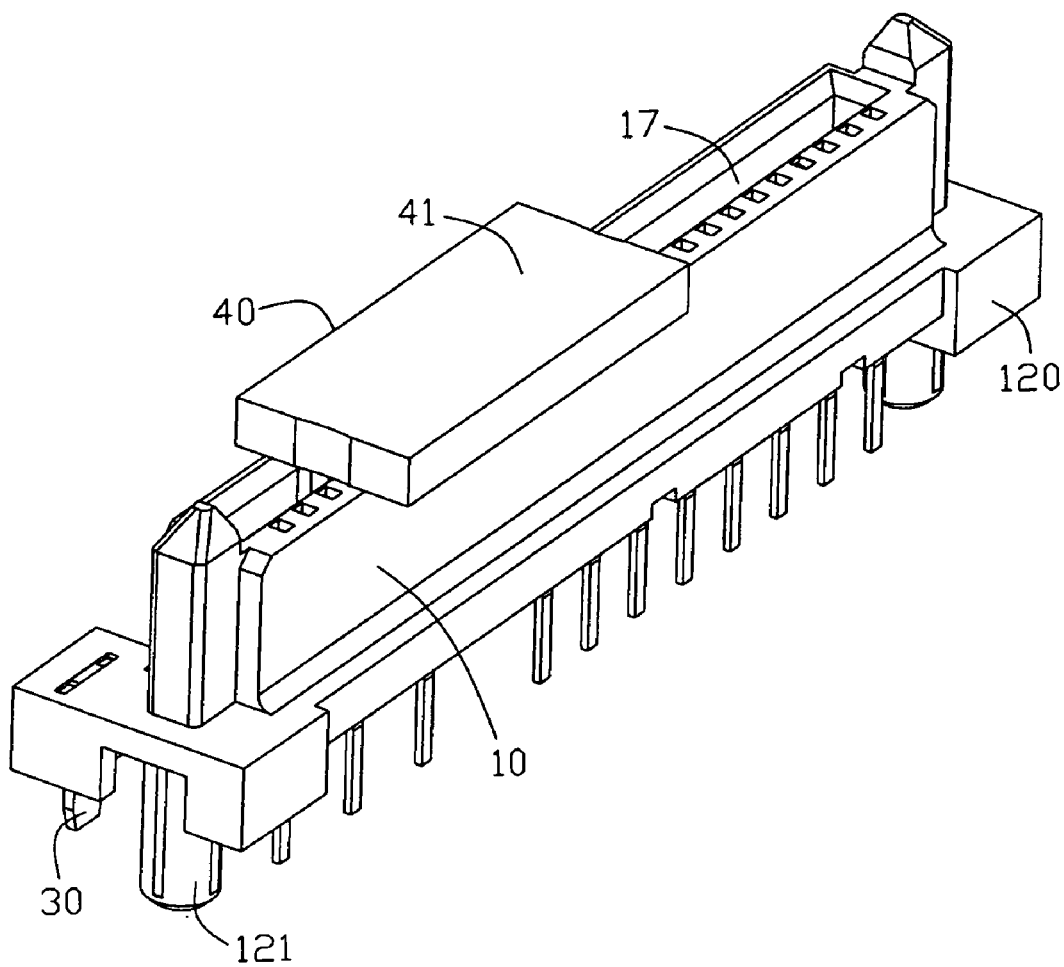
FIG. 5 is an assembled view of an electrical connector in accordance with the preferred embodiment of the present invention with the pick up cap attached to the housing.

Reference is now made to FIG. 4, the pick up cap 4 includes a baseplate 41 in a rectangle shapes, the base plate 41 including a first plane 411 provided for gripping by a vacuum device, a second plane 412 parallel to the first plane 411, and an opening 415 in a curve being disposed on the middle position of each interior sidewall in lengthwise direction. Two engaging legs 42 extend from the second plane 412 in a direction of vertical to the baseplate 41 and a space is defined between two legs, said two legs being disposed symmetrically with regard to the central line of the second plane 412 in length and width direction. Each engaging leg 42 defines a first exterior sidewall 425 vertically to the second plane 412 and a second exterior sidewall 426 adjacent and vertically to the first exterior sidewall 425, a protrusion portion 428 extending from end of the engaging leg 412 above the second exterior sidewall 426. What is needed is, largest distance between two protrusion portions 428 is slight bigger than length of the transitional portion 133 between the first and second thicker portions 131, 132 of the first side wall 13. Two resilient arms 43 are disposed at one side of the engaging leg 42, the arms being disposed on the baseplate 41 in the lengthwise direction and symmetrically arranged at the two sides of the central line (not shown) of the second plane 412. The resilient arm 43 has two opposite third exterior sidewalls 435 parallel to the first exterior sidewall 425 of the engaging leg 42, wherein the largest distance between the third exterior sidewall 435 and the first exterior sidewall 425 of the engaging leg 42 is slight bigger than that between the inner face of the first, second thicker portions 131, 132 and the inner face of the transitional portion 133 At least one rib 436 is disposed on the third exterior sidewall 435 adjacent to the engaging leg 42 for increasing the strength of the resilient arm 43. A certain space for protecting the ribs 436 from interference with the contacts 3 when the pick up cap 40 inserts into the housing 2 is defined between random two ribs 436. Both the resilient arms 43 and the legs 42 define a chamfer on end thereof to guide the pick up cap 4 inserting into the receiving cavity 17 of the housing 10.

Please referring to FIGS. 2-5, in an assembly process, the latching elements 5 insert into the retention slot 122 and the pick up cap 4 is attached to the dielectric housing 10 with the second plane 412 contacting with the hosing 10. The third exterior sidewall 435 of the resilient arms 43 props on the inner face of the first, second thicker portions 131, 132 of first wall 13. The first exterior sidewall 425 props on the inner face of the transitional portion 133 of the first side wall 13 and the projections 428 of the engaging legs 42 prop on the first, second thicker portion 2 131, 132 in the space formed by the transitional portion 133, so the pick up cap 4 is located on the housing 10.

After the pick up cap 4 is placed on the housing 10, a vacuum device is used for gripping the first plane 411 of the pick up cap 4, so the connector 1 is placed onto the PCB quickly and accurately. The first surface 1200 of the mounting portion 12 of the housing 10 contacts with the PCB, and the locating post 121 and the latching element 5 inserts into the corresponding slot on the PCB, so the connector 1 is positioned on the PCB.

When the contact 3 is welded to the PCB by use the SMT, in the process of the housing 10 being heated, because the first exterior sidewall 425 and the third exterior sidewall 435 props on the inner face of transitional portion 133 and the inner face of the first, second thicker portions 131, 132 of the first side wall 13, respectively, so the width of the engaging slot 211 is changeless. As set forth, the electrical connector 1 in accordance with the preferred embodiment of the present invention has a pick up cap 4 being able to provide a planar facilitating to be sucked by a vacuum device and avoided deformation during the process of being heated.

What is claimed is:

1. An electrical connector comprising:
   an insulative housing comprising a first side wall and a second side wall opposed to the first side wall, the first wall comprising first and second longitudinally arranged portions and a transitional portion spacing the first and the second portion, the second side wall comprising an expanded portion, the first and the second portions being thicker in a lateral direction than the transitional portion, the first and the second portions each defining a plurality of passageways therein;

a plurality of first and second contacts received in the passageways of the first, the second portions, respectively; and a pick up cap, having a baseplate attached to the housing and defining a top surface for being picked up by a vacuum device.

2. The electrical connector as claimed in claim 1, wherein the expanded portion defines a plurality of passageways, a plurality of contacts received in the passageways.

3. The electrical connector as claimed in claim 1, wherein a plurality of engaging legs extends from the baseplate and propping on inner face of the first, second portions of the first side wall and a plurality of resilient arms extending from the baseplate and propping on the inner face of the transitional portion of the first side wall.

4. The electrical connector as claimed in claim 3, wherein the engaging leg is two legs spacing from each other, said two legs being disposed symmetrically with regard to the central line of the baseplate in length and width direction.

5. The electrical connector as claimed in claim 3, wherein said resilient arm is two resilient arms disposed at one side of the engaging leg, said resilient arms being disposed on the baseplate along the length direction and symmetrically anent the central line of the baseplate in lengthwise direction.

6. The electrical connector as claimed in claim 5, wherein the engaging leg defines a first exterior sidewall vertically to the top surface of the baseplate and a second exterior sidewall adjacent and vertically to the first exterior sidewall, a protrusion portion extending from end of the engaging leg above the second exterior sidewall.

7. The electrical connector as claimed in claim 6, wherein the resilient arm further comprises two opposite third exterior sidewalls parallel to the first exterior sidewall of the engaging leg, a plurality of ribs disposed on the third exterior sidewall beside the engaging leg.

8. The electrical connector as claimed in claim 7, wherein both the resilient arms and the legs define a chamfer on end to guide the pick up cap inserting into the housing.

9. The electrical connector as claimed in claim 8, wherein the baseplate defines a curved opening in the length direction, the opening being disposed at the middle position of the exterior sidewalls.

10. The electrical connector as claimed in claim 9, further comprising a latching element.

11. An electrical connector comprising:

an unitary longitudinal insulative housing defining an uninterrupted central slot along a lengthwise direction thereof, the central slot defining a middle portion in said lengthwise direction, said housing including opposite first and second lengthwise walls located at two elongated side of said wall in a transverse direction perpendicular to said lengthwise direction;

a cavity recessed from an inner face of the central slot along said transverse direction, an expanded portion integrally formed on an exterior face of the second wall and in alignment with the cavity in said transverse direction; and a pick up cap attached to the housing, the pick up cap having a baseplate which defines a first plane provided for gripping by a vacuum device and a second plane parallel to the first plane, a plurality of engaging legs extending from the second plane of the baseplate and propping on inner face of the first, second portions of the first side wall and a plurality of resilient arms extending from the second plane and propping on the inner face of the transitional portion of the first side wall.

12. An electrical connector assembly comprising:

an insulative housing defining two opposite side walls with therebetween an elongated slot extending along a longitudinal direction of the housing;

a recess formed in one of said side walls and communicating with the slot in a transverse direction perpendicular to said longitudinal direction;

two rows of contacts respectively disposed in the side walls, each of said contacts defining a contacting portion extending into the slot in said transverse direction; and a pick-up cap including a horizontal plate covering a top face of the housing, a first downwardly extending plate engagably received in the recess, and a second downwardly extending plate received within the slot.

13. The connector assembly as claimed in claim 12, wherein the pick-up cap further includes another first downwardly extending plate engagably received in the recess and spaced opposite to said first downwardly extending plate along said longitudinal direction.

14. The connector assembly as claimed in claim 13, wherein both said first downwardly extending plates and the second downwardly extending plate extend respectively directly from the horizontal plate.

15. The connector assembly as claimed in claim 13, wherein the first downwardly extending plate and said another downwardly extending plate cooperate with each other to result in a retention force in said longitudinal direction.

16. The connector assembly as claimed in claim 12, wherein the second downwardly extending plate having a plurality of ribs thereon to form a plurality of passages each between the adjacent two ribs for receiving therein the contacting portion of the corresponding contact.

17. The connector assembly as claimed in claim 13, the side wall having no recess therein, is equipped with said contacts only in an area opposite to said recess in said transverse direction.

* * * * *